INVENTOR.
BERNARD L. WALSH, JR.,
BY [signature]
ATTORNEY.

INVENTOR.
BERNARD L. WALSH, JR.,
BY
ATTORNEY.

INVENTOR.
BERNARD L. WALSH, JR.,
BY
[signature]
ATTORNEY.

INVENTOR
BERNARD L. WALSH, JR.,
BY
[signature]
ATTORNEY 3,553,584

WIDEBAND FREQUENCY TRANSLATING CIRCUIT USING BALANCED MODULATOR

Bernard L. Walsh, Jr., Northridge, Calif., assignor to Hughes Aircraft Company, Culver City, Calif., a corporation of Delaware Continuation of application Ser. No. 523,727, Jan. 28, 1966. This application May 31, 1968, Ser. No. 736,544
Int. Cl. H03c *3/22*; H04b *7/16*
U.S. Cl. 325—9 18 Claims

ABSTRACT OF THE DISCLOSURE

A wideband frequency translating circuit especially suited for converting, en masse, television and FM signals in a given frequency range to a higher frequency range for transmission over a microwave link. Briefly, the frequency translating circuit utilizes a modulator comprising one or two varactor diodes coupled to a first pair of conjugate arms of a biconjugate hybrid network. Microwave energy is applied to a third arm and the modulated microwave energy is coupled out of the fourth arm. The wave energy corresponding to the television and FM signals to be translated is divided in a power-dividing network and applied to the diodes in opposite arms in anti-phase relationship. This modulating signal causes the effective impedance of the diodes to vary, thereby modulating the microwave energy propagating in the diode-containing conjugate arms. Appropriate filtering means can be provided at the modulator output for eliminating the carrier and lower sideband modulation components.

CROSS-REFERENCE TO RELATED APPLICATION

This application is a continuation of copending U.S. patent application of Bernard L. Walsh, Jr., Ser. No. 523,727 filed Jan. 28, 1966 entitled "Wideband Balanced Modulator," now abandoned.

FIELD OF THE INVENTION

This invention relates to high-frequency communications systems and more specifically to wideband frequency translating circuits for use in such systems.

DESCRIPTION OF THE PRIOR ART

Because of the particular propagation characteristics of electromagnetic waves in the VHF and UHF regions, television and FM broadcast receivers in many geographic areas are unable to provide reception of an acceptable quality. These areas are those which for reasons of distance or surrounding topography are unable to obtain sufficiently strong, distortionless signals directly from the main broadcast transmitters. In order to fill this gap in coverage and to provide signals to viewers and listeners who are ordinarily unable to obtain suitable reception, community antenna television systems have been employed.

Such systems, frequently termed CATV systems, generally employ an antenna or antennas advantageously located in a strong signal area to receive the transmitted signals. These signals are then relayed by suitable means to the receivers of users in the area of poor reception. If the distance over which the received signal is to be relayed is sufficiently small, a coaxial cable can be advantageously utilized as the transmission medium for the relayed signal. Frequently, however, it may be inconvenient or impractical to utilize a coaxial cable as the sole transmission medium for the relayed signal. For example, the distances separating the users and the CATV receiving unit may be so great as to prevent the economical utilization of coaxial cable. Furthermore, the impracticality of utilizing underground conduit or overhead poles within a metropolitan area may weight against the use of coaxial cable transmission media even though the physical distances involved are relatively small. In such instances it is desirable to utilize one or more microwave transmission links in the relay path between the CATV receiving unit and the users' receivers.

When microwave transmission links are utilized it then becomes necessary to translate the relatively low-frequency television or FM signals into corresponding signals in the higher frequency microwave region. In the past, this end has been achieved by demodulating each television signal separately, amplifying them separately and then remodulating the amplified signals separately onto a microwave carrier or subcarrier. It is readily seen that this approach is complex, costly and sometimes unreliable.

It is the object of the present invention, therefore, to provide apparatus capable of translating, en masse, a plurality of signals having frequencies within the television and FM broadcast bands to the microwave region.

It is another object of the present invention to provide an improved single sideband balanced modulator utilizing pumped variable capacitance diodes as the active circuit elements.

SUMMARY OF THE INVENTION

In accordance with the principles of the present invention, these objects are accomplished by utilizing pumped variable capacitance diodes in conjunction with distributed parameter transmission line elements. In one embodiment of this invention one or more of these devices, frequently termed "varactor" diodes, are disposed in the conjugate arms of a microwave hybrid network. Voltages having opposite phase but substantially identical magnitudes which correspond to the television and FM signals to be translated are impressed across the devices in each of the two arms of the hybrid network. When the devices are properly biased and matched, these signal voltages cause the devices to appear as real impedances terminating the respective conjugate arms of the hybrid network. The effective value of the impedances presented by each diode or pair of diodes in each arm varies in accordance with the applied signal voltages.

Electromagnetic wave energy from a microwave pumping source applied to a third arm of the hybrid network divides at the hybrid junction. The two components of the pumping signal propagate in substantially equal amounts in each of the conjugate arms where they are reflected at the regions of the terminating varactor diodes. Due to the varying magnitudes of the effective impedances presented by the diodes, the reflected microwave energy is modulated accordingly. The out-of-phase components of the modulated microwave energy then recombine at the hybrid junction and are transmitted as an output signal through the fourth arm thereof. By selecting the proper circuit parameters and by utilizing a suitable filter, only the upper sideband of the modulated microwave signal is transmitted out of the circuit.

BRIEF DESCRIPTION OF THE DRAWINGS

The foregoing and other objects and features of the present invention will become more readily understood by reference to the following description taken in conjunction with the accompanying drawings, in which.

DESCRIPTION OF THE PREFERRED EMBODIMENTS

Figure 1A:
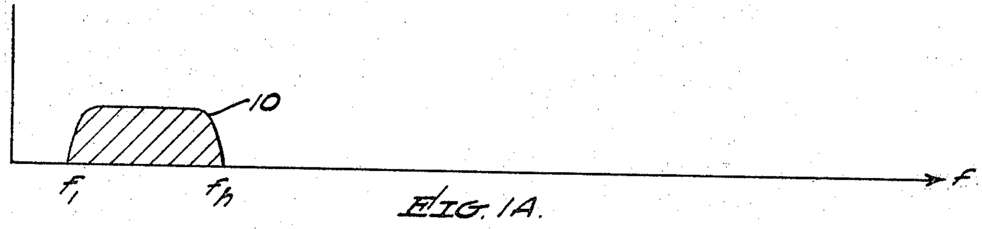
FIGS. 1A and 1B are graphical representations of a typical frequency band before and after undergoing frequency translation.

Referring more specifically to the drawings, FIG. 1A is a graphical representation of a band of frequencies 10 occupying a portion of the frequency spectrum between a low frequency $f_l$ and a high frequency $f_h$. Within the frequency range encompassed by band 10 there can be many signals of various types. As will be pointed out in greater detail hereinbelow, the present invention is primarily concerned with television and FM broadcast signals. For this purpose the low frequency $f_l$ of band 10 corresponds to approximately 50 megacycles per second and the high frequency $f_h$ corresponds to a few hundred megacycles per second.

Figure 1B:
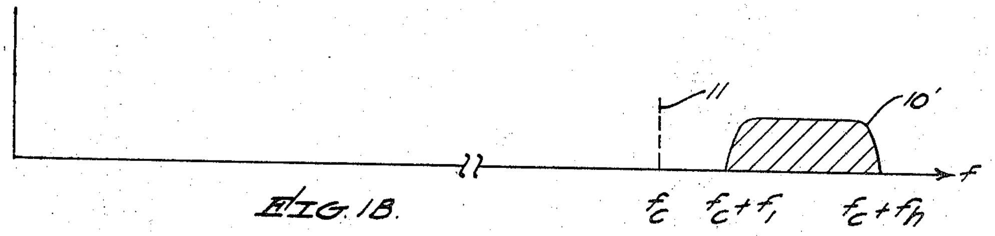

As mentioned hereinabove, it is the object of the present invention to translate, en masse, all signals appearing within the frequency band 10 to a higher frequency in the microwave region. When the frequency translation has been accomplished the resulting frequency spectrum is somewhat as shown graphically in FIG. 1B. In FIG. 1B, frequency band 10 has been converted to band 10' in the microwave region extending between frequencies $f_c+f_l$ and $f_c+f_h$. The frequency designed $f_c$ corresponds to the frequency of the microwave carrier and is indicated by dashed line 11.

Figure 2:
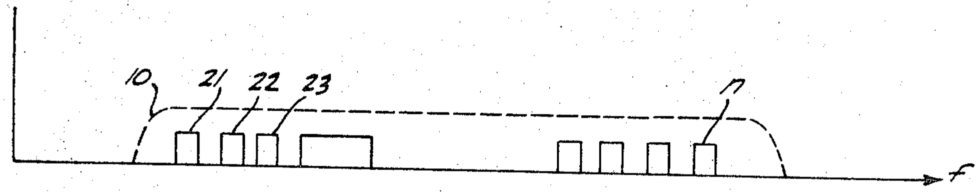
FIG. 2 is a graphical representation of the band of frequencies shown in FIGS. 1A and 1B on an expanded scale indicating a plurality of signal channels.

In FIG. 2 there is shown a graphical representation of the frequency band 10 of FIG. 1A presented on an expanded horizontal or frequency scale. Within the frequency band 10 between frequencies $f_l$ and $f_h$ are a plurality of individual signal channels 21, 22, 23 . . . *n* which, typically, can comprise television or FM broadcast channels. The exact range of frequencies occupied by channels 21, 22, 23 . . . *n* are, of course, generally allocated by an appropriate governmental agency. In the United States, for example, the Federal Communications Commission has allocated commercial television channels 2 through 6 to frequency channels within the range of 54 to 88 megacycles per second. The commercial FM broadcast band has been allocated that portion of the frequency spectrum between 88 and 108 megacycles per second and the commercial television broadcast channels 7 through 13 have been allocated frequencies within the range extending between 174 and 216 megacycles per second.

Figure 3:
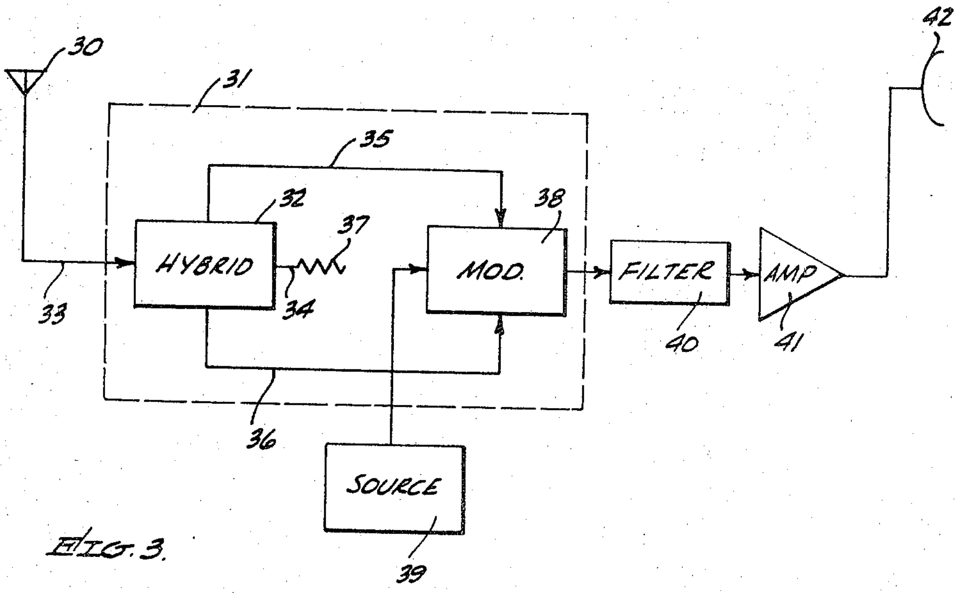
FIG. 3 is a block diagram of a frequency translating circuit in accordance with the present invention.

In FIG. 3 there is shown a simplified block diagram of a station apparatus capable of receiving signals within frequency band 10 and translating them to the microwave region for transmission. The station apparatus of FIG. 2 comprises a receiving antenna 30 adapted to receive television and FM signals occurring within the frequency band 10 of FIGS. 1A and 2. In practice, receiving antenna 30 can comprise any suitable antenna known in the art. Depending on the available signal strength, antenna 30 can comprise a single broad-band antenna or, in the alternative, several high-gain, narrow-band antennas. In any event, antenna 30 is connected by suitable transmission line means to the up-converter described hereinafter.

Within the rectangular block 31 enclosed by the dashed line is an up-converter circuit in accordance with the principles of the present invention. The up-converter comprises a four-port broad-band hybrid network 32 having two pairs of conjugate arms 33 and 34, and 35 and 36. Hybrid network 32 can comprise any suitable power-dividing (sometimes referred to as "3-dB") hybrid networks well-known in the art. Receiving antenna 30 is coupled to input arm 33. Arm 34 is advantageously terminated by a non-reflecting load impedance 37. Conjugate arms 35 and 36 are, in turn, coupled to the modulator 38, as is a microwave pumping source 39. The output of modulator 38 is coupled to a high-pass filter 40 which is adapted to pass only frequencies within the upper sideband of the modulated microwave signal. The output of filter 40 is then coupled to a microwave amplifier 41 which, in turn, feeds a microwave transmitting antenna 42.

In operation, television and FM signals are received by receiving antenna 30 and applied to input arm 33 of hybrid network 32. The wave energy corresponding to these signals is then divided within hybrid network 32 and transmitted to conjugate arms 35 and 36. Although the present description contemplates a one-hundred eighty degree phase difference between the electromagnetic wave energy in arms 35 and 36, it is readily apparent that this relative phase difference can be greater or less. Appropriate phase compensating means well-known in the art can be employed in such event to provide the desired phase difference. In any event, the electromagnetic wave energy thus divided is coupled in substantially equal amounts to modulator 38. These signals are utilized to modulate a microwave signal derived from pumping source 39. The output of modulator 38, in general, comprises a carrier signal at the pumping frequency, together with upper and lower sideband modulation components. The carrier and lower sideband frequency components can be attenuated by filtering means integral to modulator 38 or by the utilization of filter 40 at the output thereof. The modulated upper sideband component is then coupled to amplifier 41 which, for example, can comprise a traveling wave tube or other suitable microwave amplifier known in the art. The amplified upper sideband signal is then fed to the microwave transmitting antenna 42 for radiation. In general, antenna 42 can comprise any suitable high-gain directional microwave antenna such as a parabolic dish or horn antenna.

Figure 4:
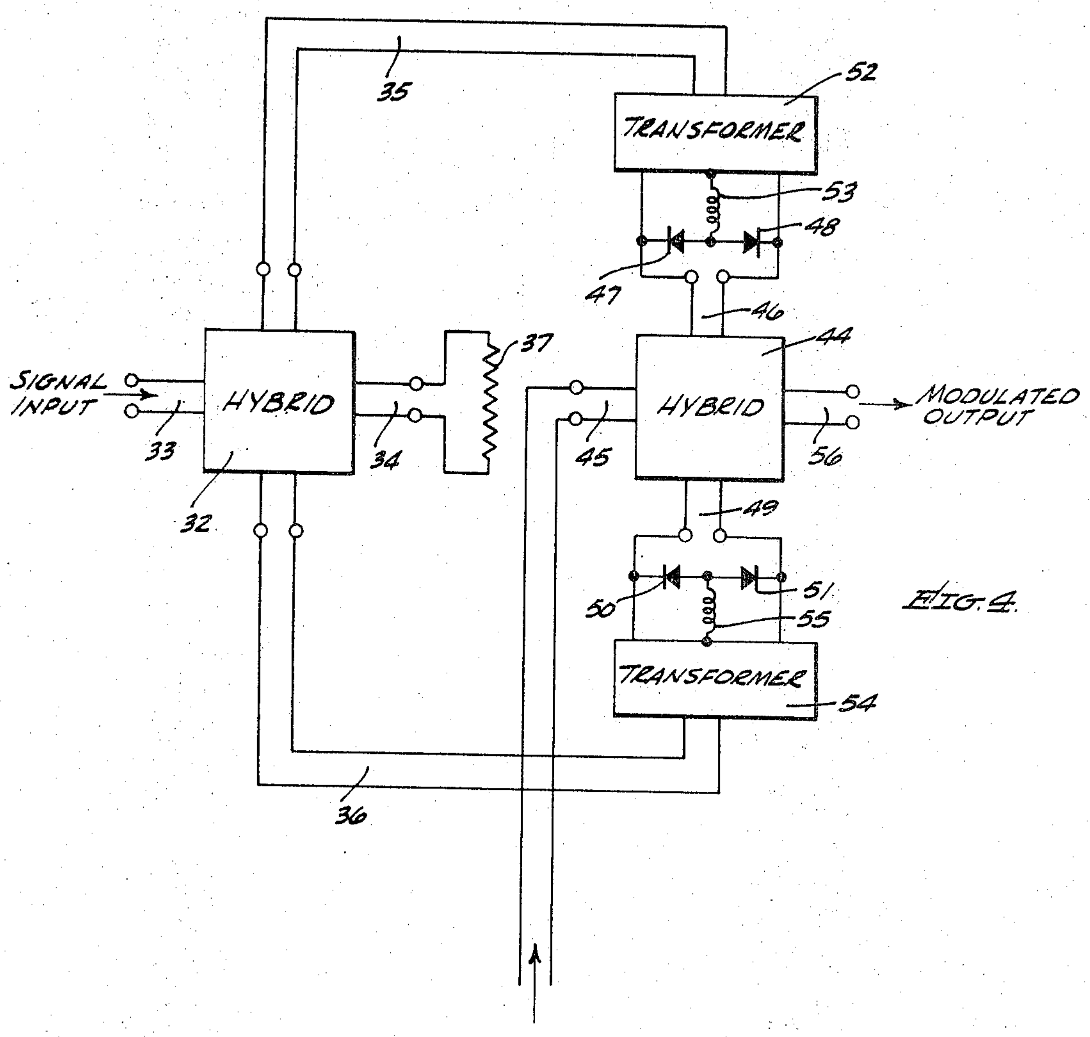
FIG. 4 is a block diagram of one embodiment of the present invention utilized in the circuit of FIG. 3.

Turning now to FIG. 4, there is shown in block diagram one embodiment of the present invention. In FIG. 4 the portion of FIG. 3 enclosed within block 31 is shown in greater detail and, where appropriate, like numerals have been carried over to designate like circuit elements. The embodiment of FIG. 4 comprises a first and second hybrid network 32 and 44, each having two pairs of conjugate arms. Hybrid network 32, as mentioned above, serves as a power-dividing network for dividing the power of the incoming television and FM signals and applying these signals to the modulator. The modulator itself utilizes the second hybrid network 44. The microwave pumping signal from the pumping source is applied to a first arm 45 of a first pair of conjugate arms of hybrid network 44. One arm 46 of the second conjugate pair of hybrid network 44 is terminated by a pair of variable capacitance diodes 47 and 48 connected in a back-to-back relationship. The other arm 49 of the second conjugate pair is terminated by a substantially identical pair of diodes 50 and 51 similarly connected.

Although a wide variety of commercially available variable capacitance diodes can be employed in the present invention, the so-called "multiplier" or "abrupt junction" types are especially useful. These diodes are characterized by a relatively high breakdown voltage on the order of 30 to 60 volts and a cutoff frequency on the order of 150 to 200 kilomegacycles per second. In practice, these diodes are reversed biased by a suitable direct current biasing source at a point in the midregion of their capacitance-versus-voltage operating curve. For the sake of clarity, the direct current biasing means has been omitted from the block diagram of FIG. 4, but can comprise any suitable supply of relatively low-voltage direct current.

One of the conjugate arms 35 of power-dividing hybrid network 32 is coupled to diodes 47 and 48 through an impedance matching transformer 52. An inductor 53 is connected between transformer 52 and the junction formed by the interconnection of diodes 47 and 48. Inductor 53 provides the required inductance to resonate the diodes over the frequency band of the modulating signals. In a similar manner, arm 36 of hybrid network 32 is coupled through a second impedance matching transformer 54 to diodes 50 and 51. A second resonating inductor 55 is also connected between the junction formed by the interconnection of diodes 50 and 51 and transformer 54. The output of the modulator is taken from output port 56 which is coupled to the remaining circuitry shown in FIG. 3.

The operation of the embodiment of FIG. 4 has already been partially explained hereinabove in connection with the description of the circuit of FIG. 3. Continuing that description, the relatively low-frequency wave energy corresponding to the television and FM broadcast signals are intercepted at the receiving antenna and applied to input arm 33 of power-dividing hybrid network 32. The input power is divided therein and applied to transformers 52 and 54 through arms 35 and 36 respectively. Ideally, substantially no reflected wave energy is propagated in the reverse direction in arms 35 and 36. However, since it is relatively difficult to design transformers and components which are perfectly matched over the band of frequencies of the extent contemplated by the invention, some reflected wave energy will occur. In this event, depending on the relative phase of the reflected power, a portion thereof will be dissipated in matched load impedance 37 terminating arm 34. The remainder will be coupled out of the hybrid network 32 through arm 33, whereupon it can be eliminated if desirable.

The microwave pumping energy is applied to arm 45 of the second hybrid network 44 where it too is divided. The divided pumping signal then propagates in arms 46 and 47 away from hybrid 44. In each arm the pumping energy impinging on the respective diodes is reflected by an amount dependent upon the effective impedance presented by the diodes. By way of review, it is recalled that the voltage reflection coefficient for a transmission line terminated by an impedance is given by the relation:

$$\rho=\frac{Z_e-Z_o}{Z_e+Z_o} \qquad (1)$$

where $\rho$ is the reflection coefficient, $Z_o$ is the characteristic impedance of the transmission line and $Z_e$ is the effective impedance of the terminating impedance. This effective impedance of diodes 47, 48 and 50, 51 varies in accordance with the modulating potential applied thereto through transformers 52, 54 respectively. Thus, the wave energy reflected from diodes 47, 48 and 50, 51 comprises a carrier signal at the pump frequency and amplitude modulation components in the upper and lower sidebands.

Advantageously, if the hybrid structure 44 is constructed of conductive waveguides as in a magic-T hybrid, the dimensions thereof can be selected so that frequencies in the lower sideband are below the cutoff frequency. By virtue of the fact that the modulating potential applied to the diodes in conjugate arms 46 and 49 are 180 degrees out-of-phase, the reflected wave energy in the upper sideband will also be out-of-phase as it propagates back toward hybrid network 44. The two components of the modulated upper sideband will, therefore, recombine and be transmitted out of hybrid network 44 through output port 56.

The wave energy components at the carrier or pumping frequency, however, are reflected in phase and are not coupled out of output arm 56. The portions of the carrier and lower sideband signal which are not cancelled or attenuated will, of course, be substantially eliminated by filter 40 shown in FIG. 3.

Figure 5:
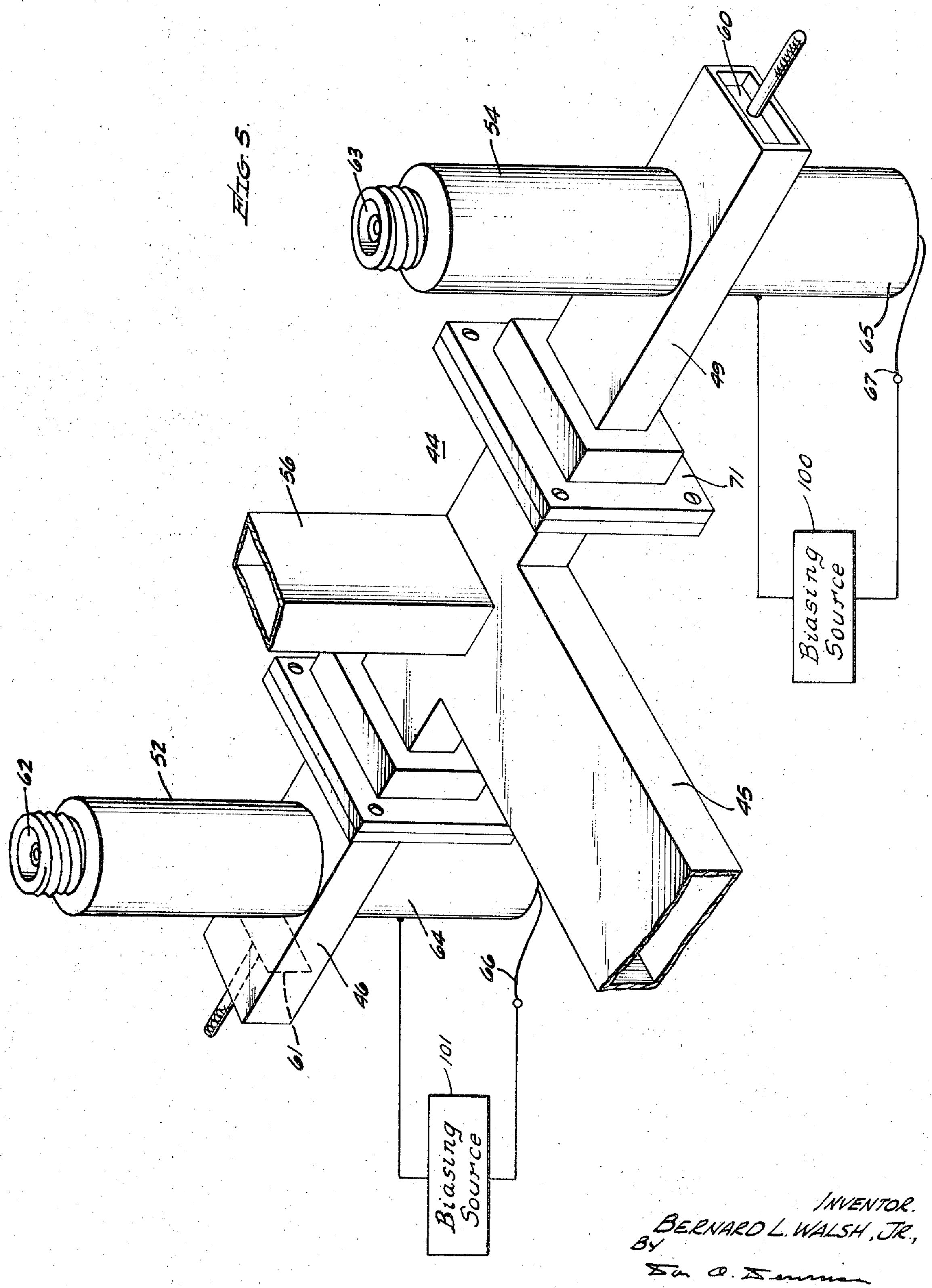
FIG. 5 is a pictorial view of another embodiment of the present invention utilizing conductively bounded waveguide components.

A practical modulator structure which can be utilized in practicing the present invention is shown in the pictorial view of FIG. 5. Again, where appropriate, like numerals have been carried over from FIG. 4 to designate like circuit elements. The embodiment of FIG. 5 comprises a hybrid network 44 of the magic-T variety having an H-plane input arm 45 and an E-plane output arm 56. The two conjugate arms 46 and 49 extend in opposite directions at right angles to input arm 45. Conjugate arms 46 and 49 are provided with movable pistons or plungers 60 and 61 for tuning purposes and to prevent any radiation from passing out of the arms.

In the embodiment illustrated in FIG. 4, a pair of diodes were utilized in each of the arms of hybrid network 44. By utilizing two diode pairs it is possible to achieve a greater power handling capability in the modulator. However, if diodes are utilized in pairs, it is desirable that they be very accurately matched. That is, the parasitic capacitances and inductances of the diodes and their corresponding holders should be substantially equal. In practice, it may be difficult to obtain diodes which are so characterized. Thus, it may be desirable to utilize but a single diode in each of the modulator hybrid network arms. Thus the embodiment is FIGS. 5 and 6 is so illustrated.

In any event, the varactor diodes are disposed within arms 46 and 49 in a manner to be explained in greater detail hereinbelow. The impedance matching transformers 52 and 54 are shown in FIG. 5 as coaxial line sections disposed above the upper broad walls of the wave-guide sections comprising arms 46 and 49 respectively. The structural details of these transformers will also be described in connection with the cross-sectional view of FIG. 6. The transformers 52 and 54, however, are provided with coaxial connectors 62 and 63, to which the television and FM modulating signals are coupled. Below waveguide sections 46 and 49 are disposed filter structures 64 and 65 respectively. Direct current biasing leads 66 and 67 extend through filters 64 and 65 are conductively connected to one electrode of the varactor diodes. Biasing sources 100 and 101 comprising suitable sources of low voltage direct current are connected to biasing leads 67 and 66 respectively. The direct current return path for the bias is provided, for example, by means of the inner conductors of the coaxial connectors 62 and 63. The interior structural details of arms 46 and 49 are shown in the cross-sectional view of FIG. 6.

Figure 6:
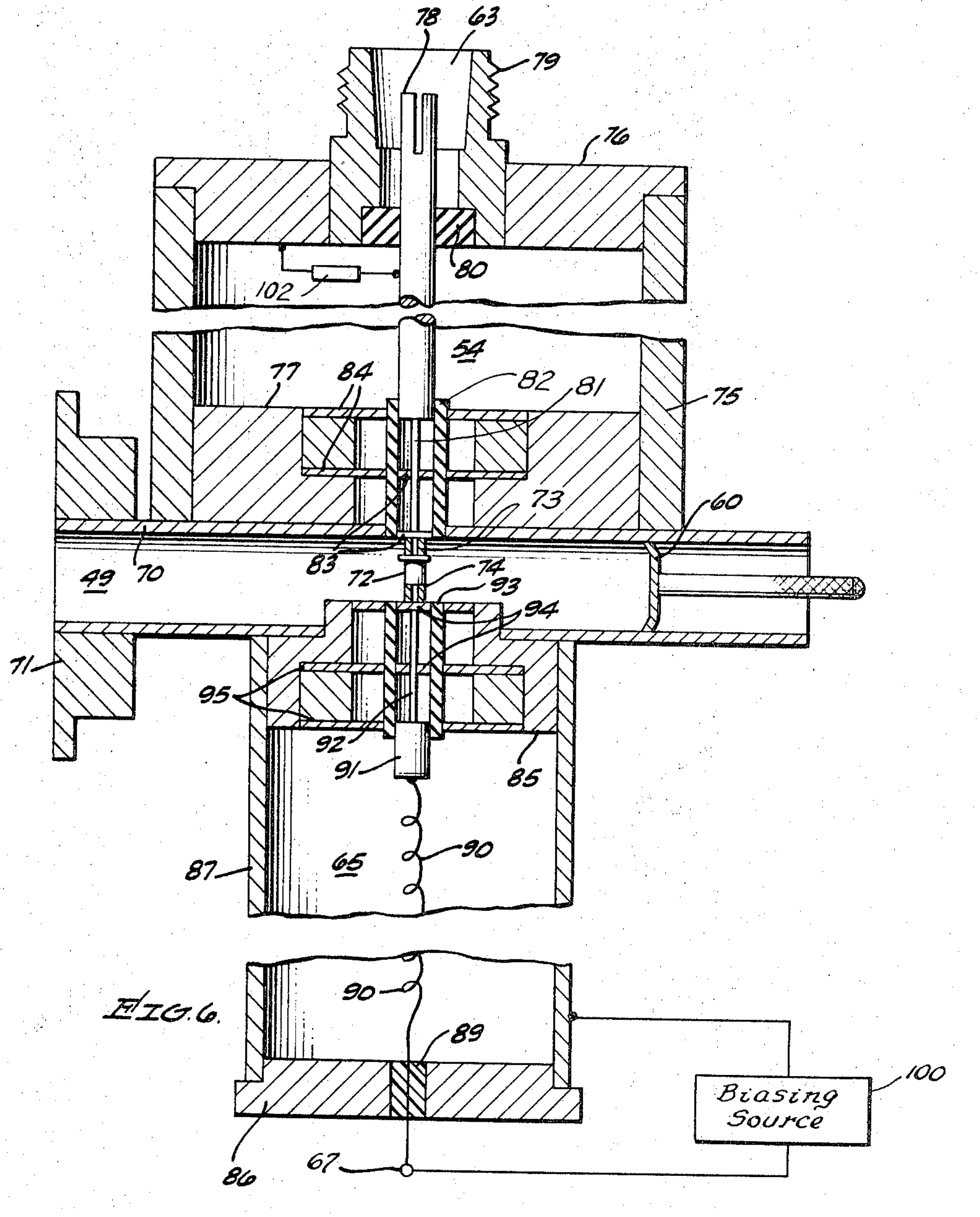
FIG. 6 is a cross-sectional view of a portion of the embodiment of FIG. 5.

In FIG. 6, the cross-section of arm 49 taken through the axis of the waveguide is shown. In this figure a section of rectangular waveguide provides the electromagnetic transmission path for wave energy propagating in arm 49. A waveguide connecting flange 71 is affixed to one end of waveguide section 70 to facilitate mechanical connection to the magic-T hybrid 44. A movable shorting piston 60 is provided at the other end region of waveguide section 70 as previously mentioned. A varactor diode 72 is disposed within waveguide section 70 and is held in place by means of conductive diode holder members 73 and 74 disposed above and below the diode respectively.

A coaxial transformer section 54 comprising a cylindrical outer conductor 75 and disklike end plates 76 and 77 is disposed adjacent the upper broad wall of waveguide section 70. A female coaxial connector 63, having an inner conductor 78 and outer conductor 79, extends through transformer end member 76. Inner conductor 78 is conductively insulated from outer conductor 79 by means of dielectric spacer or washer 80. An RF choke 102 is conductively connected between inner conductor 78 and end member 76 to serve as a direct current bias return for varactor diode 72. A length of conductive wire 81 extends between diode holder member 73 and center conductor 78 through a dielectric sleeve 82. Wire 81 is positioned coaxially within sleeve 82 by means of conductive washers or spacers 83. Sleeve 82, in turn, is held in place in the axially extending aperture in end plate 77 by means of conductive spacers 84.

Disposed adjacent the lower broad surface of waveguide section 70 is a third disklike conductive end plate 85 which is joined to a fourth disklike conductive end plate 86 by means of outer conducting sleeve 87. End plates 85 and 86 and conducting sleeve 87 thus form a cavity through which the biasing current to diode 72 is applied. This biasing current from biasing source 100 is applied to lead 67, one end of which passes through end member 86 and is conductively insulated therefrom by means of dielectric sleeve 89. Within the cavity formed by sleeve 87 and end plates 85 and 86, lead 67 is wound in the form of helical coil 90. The other end of lead 67 is then conductively connected to a coil holder 91 having the form of a short length of conductive rod. Coil holder 91 and lower diode holder member 74 are conductively joined by a short length of conductive wire 92. Wire 92 extends through an elongated aperture in end plate 85 and is insulated therefrom by means of a dielectric insulating sleeve 93. Wire 92 is positioned coaxially within sleeve 93 by means of conductive washer or spacers 94. Sleeve 93, in turn, is positioned coaxially within the axially located aperture in end member 85 by means of larger conductive washer or spacers 95.

In operation, the various combinations of structural components function as the lumped parameter elements shown in the block diagram of FIG. 4. Specifically, when assembled, a pair of substantially identical units such as shown in FIG. 6 are disposed at opposite conjugate arms of a magic-T hybrid structure. The assembled unit is described above in connection with FIG. 5. Microwave energy at the pumping frequency is divided in the magic-T and propagated in substantially equal amounts away from the junction and towards the varactor diodes 72 in the conjugate arms. The microwave energy in each of the arms is then partially reflected at the corresponding diode. The degree of reflection, as mentioned above, is determined by the effective impedance of the diodes which varies in accordance with the modulating potential derived from the television or FM broadcast signals.

These modulating potentials are applied to the diodes through the coaxial connectors 63. The transformer for matching the impedance of the diode to the coaxial input is provided by the coaxial section comprising inner conductor 78 and outer conductor 75. A first low-pass filter section is formed by the conductive wire 81 and conductive spacers 83 and 84. This low-pass filter section is effectively in series with diode 72 and serves to prevent any of the microwave energy at the pumping frequency or sidebands from entering the modulating circuit.

A second low-pass filter section comprising conductive wire 92 and conductive spacers 94 and 95 is provided at the lower side of the diode. This second filter serves to prevent any of the microwave energy from entering the direct current biasing circuit. A third filter section formed by coil 90 in the biasing lead 67, acting in conjunction with the bypass capacitor formed by lead 67 passing through end plate 86, in turn, serves to prevent the relatively low-frequency modulating current from entering the direct current biasing circuit.

In all cases it is understood that the above-described embodiments are merely illustrative of but a small number of the many possible specific embodiments which can represent applications of the principles of the present invention. Numerous and varied other arrangements can be readily devised in accordance with these principles by those skilled in the art without departing from the spirit and scope of the invention.

What is claimed is:

1. A wideband frequency translating circuit comprising, in combination:
- a power-dividing network having at least one input port and a pair of output ports;
- means for applying a plurality of radio frequency signals to said input port, said signals having frequency components extending over a given band of the frequencies;
- a hybrid network having at least two pairs of conjugate arms;
- a first arm of a first of said pairs being coupled to receive microwave energy of a given frequency;
- at least one varactor diode electromagnetically coupled to each arm of the second pair of conjugate arms;
- means coupled to each of said diodes for impressing a direct current biasing potential thereon;
- means for electromagnetically coupling the radio frequency signals from each of said output ports of said power-dividing network to said varactor diodes in each of said arms respectively, said radio frequency signals coupled to the varactor diodes in one arm being in phase opposition to the signal wave energy coupled to the varactor diodes in the other arm; and
- means coupled to said hybrid network for extracting modulated microwave energy from the second arm of said first conjugate pair.

2. The wideband frequency translating circuit according to claim 1, wherein said hybrid network comprises a magic-T.

3. The wideband frequency translating circuit according to claim 1, wherein said varactor diodes are of the abrupt-junction type.

4. The wideband frequency translating circuit according to claim 1, wherein said signals are characterized by carrier waves having modulation components of diverse modulation types.

5. The wideband frequency translating circuit according to claim 4, wherein said diverse modulation types include FM and AM.

6. A wideband frequency translating circuit comprising, in combination:
- antenna means adapted to receive a plurality of radio frequency signals having frequency components extending over a given band of frequencies, said signals being characterized by carrier waves having information containing modulation components of diverse modulation types;
- a power-dividing network having at least one input port and a pair of output ports;
- means for coupling said received signals to said input port;
- a hybrid network having at least two pairs of conjugate arms;
- at least one varactor diode disposed in the end region of each arm of a first of said pairs of conjugate arms, each of said diodes being electromagnetically coupled to its corresponding arm;
- means coupled to each of said diodes for impressing a direct current biasing potential thereon;
- means for coupling each of said output ports of said power-dividing network to said diodes in one of said arms;
- means for applying electromagnetic energy at a microwave carrier frequency to a first arm of a second of said pairs of conjugate arms of said hybrid network; and
- means for extracting electromagnetic wave energy from the other arm of said second pair of conjugate arms.

7. The wideband frequency translating circuit according to claim 6, including means for applying said extracted electromagnetic wave energy to microwave transmission means.

8. The wideband frequency translating circuit according to claim 6 wherein said hybrid network comprises a magic-T.

9. The wideband frequency translating circuit according to claim 6, wherein said varactor diodes are of the abrupt-junction type.

10. The wideband frequency translating circuit according to claim 6, wherein said diverse modulation types include FM and AM.

11. A wideband frequency translating circuit comprising, in combination:

a power-dividing network having at least one input port and a pair of output ports;

a source of radio frequency signals, said signals comprising a plurality of carriers having information components of diverse modulation type, the frequency components of said signals extending over a given band of frequencies;

means for coupling said source of radio frequency signals to said input port of said power-dividing network;

a hybrid network having at least two pairs of conjugate arms;

a first arm of a first of said pairs being coupled to receive microwave energy of a given frequency;

at least one varactor diode electromagnetically coupled to each arm of the second pair of conjugate arms;

means coupled to each of said diodes for impressing a direct current biasing potential thereon;

means for electromagnetically coupling the radio frequency signals from each of said output ports of said power-dividing network to said varactor diodes in each of said arms respectively, said radio frequency signals coupled to the varactor diodes in one arm being in phase opposition to the signal wave energy coupled to the varactor diodes in the other arm; and means coupled to said hybrid network for extracting modulated microwave energy from the second arm of said first conjugate pair.

12. The wideband frequency translating circuit according to claim 11, wherein said hybrid network comprises a magic-T.

13. The wideband frequency translating circuit according to claim 11, wherein said varactor diodes are of the abrupt-junction type.

14. The wideband frequency translating circuit according to claim 11, wherein said diverse modulation types include FM and AM.

15. A wideband frequency translating circuit comprising, in combination:

receiving antenna means capable of receiving a plurality of relatively low frequency signals having frequency components extending over a given band of frequencies;

a source of unmodulated microwave energy having a frequency substantially higher than said given band of frequencies;

transmitting antenna means capable of radiating microwave energy;

a power-dividing network having at least one input port and a pair of output ports;

means for coupling said receiving antenna to said input port;

a hybrid network having at least two pairs of conjugate arms;

means for coupling a first arm of a first of said conjugate pairs to said source of unmodulated microwave energy;

at least one varactor diode electromagnetically coupled to each arm of the second pair of conjugate arms;

means coupled to each of said diodes for impressing a direct current biasing potential thereon;

means for electromagnetically coupling the low frequency signals from each of said output ports of said power-dividing network to said varactor diodes in each of said arms respectively, said low frequency signals coupled to the varactor diodes in one arm being in phase opposition to the signals coupled to the varactor diodes in the other arm; and means for coupling the second arm of said first conjugate pair of said transmitting antenna means.

16. The wideband frequency translating circuit accordin to claim 15, wherein said means for coupling said second arm of said first conjugate pair to said transmitting antenna means includes a microwave amplifier.

17. The wideband frequency translating circuit according to claim 15, wherein said hybrid network comprises a magic-T.

18. The wideband frequency translating circuit according to claim 15, wherein said varactor diodes are of the abrupt-junction type.

References Cited

UNITED STATES PATENTS

| | | | |
|---|---|---|---|
| 2,703,865 | 3/1955 | Grayson et al. | 332—18 |
| 2,863,042 | 12/1958 | Sanders et al. | 325—449X |
| 3,243,731 | 3/1966 | Erickson | 332—30VX |
| 3,096,474 | 7/1963 | Marié | 332—30(VX) |
| 3,388,336 | 6/1968 | Mattern | 325—137X |

ALFRED L. BRODY, Primary Examiner

U.S. Cl. X.R.

307—320; 325—446, 449; 329—161; 332—30